(12) United States Patent
Wang et al.

(10) Patent No.: US 7,786,463 B2
(45) Date of Patent: Aug. 31, 2010

(54) NON-VOLATILE MULTI-BIT MEMORY WITH PROGRAMMABLE CAPACITANCE

(75) Inventors: Xuguang Wang, Maple Grove, MN (US); Shuiyuan Huang, Apple Valley, MN (US); Dimitar V. Dimitrov, Edina, MN (US); Michael Xuefei Tang, Bloomington, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 224 days.

(21) Appl. No.: 12/123,685

(22) Filed: May 20, 2008

(65) Prior Publication Data
US 2009/0289240 A1 Nov. 26, 2009

(51) Int. Cl.
*H01L 45/00* (2006.01)
(52) U.S. Cl. .................................. 257/2; 257/E45.002
(58) Field of Classification Search ..................... 257/3, 257/4, 246, 248, E45.002, 2; 365/148
See application file for complete search history.

(56) References Cited

U.S. PATENT DOCUMENTS

| | | | |
|---|---|---|---|
| 5,761,115 | A | 6/1998 | Kozicki et al. |
| 6,894,304 | B2 | 5/2005 | Moore |
| 6,903,361 | B2 | 6/2005 | Gilton |
| 7,116,577 | B2 | 10/2006 | Eitan |
| 7,169,635 | B2 | 1/2007 | Kozicki |
| 7,202,520 | B2 | 4/2007 | Gilton |
| 7,276,722 | B2 | 10/2007 | Gilton |
| 7,282,783 | B2 | 10/2007 | Campbell |
| 2006/0118848 | A1 | 6/2006 | Kozicki et al. |
| 2007/0210348 | A1* | 9/2007 | Song et al. .................. 257/246 |

OTHER PUBLICATIONS

U.S. Appl. No. 12/123,662, filed May 20, 2008, Xuguang Wang.
Kozicki et al., Nanoscale Memory Elements Based on Solid-State Electrolytes, IEEE Transactions on Nanotechnology, vol. 4, No. 3, May 2005, pp. 331-338.

(Continued)

*Primary Examiner*—Jerome Jackson, Jr.
*Assistant Examiner*—Paul A Budd
(74) *Attorney, Agent, or Firm*—Campbell Nelson Whipps LLC

(57) ABSTRACT

Non-volatile multi-bit memory with programmable capacitance is disclosed. Illustrative data memory units include a substrate including a source region and a drain region. A first insulating layer is over the substrate. A first solid electrolyte cell is over the insulating layer and has a capacitance that is controllable between at least two states and is proximate the source region. A second solid electrolyte cell is over the insulating layer and has a capacitance or resistance that is controllable between at least two states and is proximate the drain region. An insulating element isolates the first solid electrolyte cell from the second solid electrolyte cell. A first anode is electrically coupled to the first solid electrolyte cell. The first solid electrolyte cell is between the anode and the insulating layer. A second anode is electrically coupled to the second solid electrolyte cell. The second solid electrolyte cell is between the anode and the insulating layer. A gate contact layer is over the substrate and between the source region and drain region and in electrical connection with the first anode and the second anode. The gate contact layer is electrically coupled to a voltage source.

20 Claims, 4 Drawing Sheets

OTHER PUBLICATIONS

Eitan et al., NROM: A Novel Localized Trapping, 2-Bit Nonvolatile Memory Cell, IEEE Electron Device Letters, vol. 21, No. 11, Nov. 2000, pp. 543-545.

Kozicki et al., Mass Transport in Chalcogenide Electrolyte Films-Materials and Applications, Journal of Non-Crystalline Solids 354 (2006), pp. 567-577.

* cited by examiner

NON-VOLATILE MULTI-BIT MEMORY WITH PROGRAMMABLE CAPACITANCE

BACKGROUND

Nonvolatile memory is a type of memory that retains stored data when power is removed from the memory. There are various types of nonvolatile memories including e.g., flash memory.

Flash memory cells make use of a floating-gate covered with an insulating layer. There is also a control gate which overlays the insulating layer. Below the floating gate is another insulating layer sandwiched between the floating gate and the cell substrate. This insulating layer is an oxide layer and is often referred to as the gate oxide or tunnel oxide. The substrate contains doped source and drain regions, with a channel region disposed between the source and drain regions. The floating-gate transistors generally include n-channel floating-gate field-effect transistors, but may also include p-channel floating-gate field-effect transistors. Access operations are carried out by applying biases to the transistor.

In a flash memory device, cells are often organized into blocks and the charge state of the floating gate indicates the logical state of the cell. For example, a charged floating gate may represent a logical "1" while a non-charged floating gate may represent a logical "0." A flash memory cell may be programmed to a desired state by first erasing the cell to a logical "0" and, if necessary, writing the cell to a logical "1." Typically, flash memory devices are organized so that a write operation can target a specific cell while an erase operation affects an entire block of cells. Changing any portion of one block therefore requires erasing the entire block and writing those bits in the block which correspond to a logical "1".

The charge stored on the floating gate is prone to leaking, thus affecting the data memory retention and endurance of the flash memory device. In addition, dual-bit or multi-bit flash memory cells have been studied to aid in increasing the memory density without physically reducing the scale of the memory cells. These memory cells can suffer from slow programming erase speed, degraded reliability due to memory window and electron/hole charge center mismatch. In addition, passing electrons thorough the gate oxide layer of the gate during the program, erase, and reading operation degrade the lifetime of the memory cell.

BRIEF SUMMARY

The present disclosure relates to non-volatile multi-bit memory having a programmable capacitance. In particular, the multi-bit memory can have its threshold voltage changed by changing the capacitance of each solid electrolyte cell of the memory gate stack. One approach to changing the capacitance each solid electrolyte cell of the memory gate stack is to utilize electrochemical reactions to build or break metal dendrites in each solid electrolyte cell within the gate stack. Particular multi-bit memory unit architectures including the solid electrolyte cells are disclosed.

In one particular embodiment, a multi-bit memory unit includes a substrate having a source region and a drain region. A first insulating layer is over the substrate. A first solid electrolyte cell is over the insulating layer and has a capacitance that is controllable between at least two states and is proximate the source region. A second solid electrolyte cell is over the insulating layer and has a capacitance that is controllable between at least two states and is proximate the drain region. An insulating element isolates the first solid electrolyte cell from the second solid electrolyte cell. A first anode is electrically coupled to the first solid electrolyte cell. The first solid electrolyte cell is between the anode and the insulating layer. A second anode is electrically coupled to the second solid electrolyte cell. The second solid electrolyte cell is between the anode and the insulating layer. A gate contact layer is over the substrate and between the source region and drain region and in electrical connection with the first anode and the second anode. The gate contact layer is electrically coupled to a voltage source.

In another particular embodiment, a multi-bit memory unit includes a substrate having a source region and a drain region. An insulating layer is over the substrate. A first solid electrolyte cell is disposed between a first anode and a first barrier layer. The first solid electrolyte cell is over the insulating layer and has a capacitance that is controllable between at least two states. A second solid electrolyte cell is disposed between a second anode and a second barrier layer. The second solid electrolyte cell is over the insulating layer and has a capacitance that is controllable between at least two states. A gate contact layer is over the substrate and between the source region and drain region and in electrical connection with the first anode and the second anode. The gate contact layer is electrically coupled to a voltage source. The first solid electrolyte cell is located closer to the source region than the second solid electrolyte cell and the second solid electrolyte cell is located closer to the drain region than the first solid electrolyte cell. The first solid electrolyte cell is electrically isolated from the second solid electrolyte cell.

In another embodiment, a multi-bit non-volatile memory unit includes a substrate including a source region and a drain region. The source region is electrically coupled to a source voltage source and the drain region is electrically coupled to a drain voltage source. An insulating layer is over the substrate. A first solid electrolyte cell is disposed between a first electrochemically active anode and a first barrier layer. The first solid electrolyte cell is over the insulating layer. The first solid electrolyte cell has a capacitance that is controllable between at least two states. A second solid electrolyte cell is disposed between a second electrochemically active anode and a second barrier layer. The second solid electrolyte cell is over the insulating layer. The second solid electrolyte cell has a capacitance that is controllable between at least two states. A gate contact layer is over the substrate and between the source region and drain region and in electrical connection with the first electrochemically active anode and the second electrochemically active anode. The gate contact layer is electrically coupled to a gate voltage source. The first solid electrolyte cell is located closer to the source region than the second solid electrolyte cell and the second solid electrolyte cell is located closer to the drain region than the first solid electrolyte cell. The first solid electrolyte cell, first anode and first barrier layer are electrically isolated from the second solid electrolyte cell, second anode and second barrier layer.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
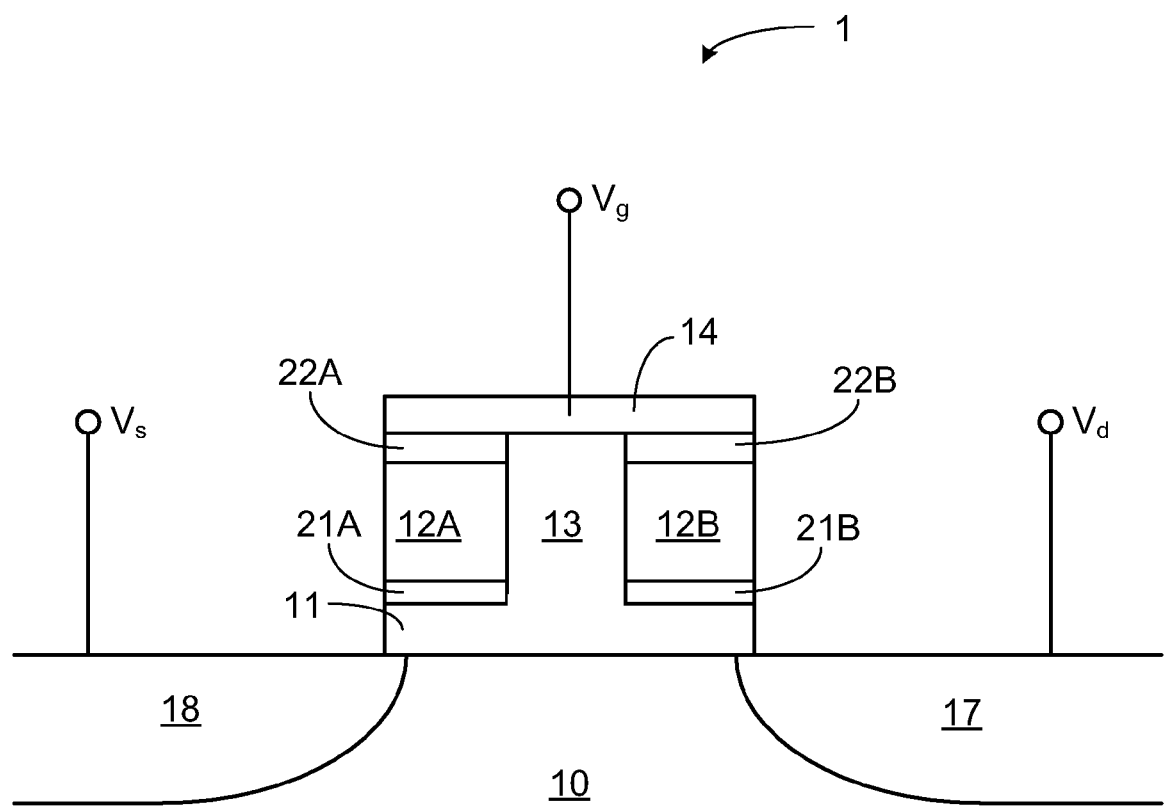
FIG. 1 is a schematic cross-sectional diagram of an illustrative non-volatile multi-bit memory unit having programmable capacitance.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to non-volatile multi-bit memory having a programmable capacitance. In particular, the multi-bit memory can have its threshold voltage changed by changing the capacitance of each solid electrolyte cell of the memory gate stack. One approach to changing the capacitance, resistance, or conductivity (hereinafter referred to as capacitance) of each solid electrolyte cell of the memory gate stack is to utilize electrochemical reactions to build or break metal dendrites in each solid electrolyte cell within the gate stack. Particular multi-bit memory unit architectures including the solid electrolyte cells are disclosed. Theses include single transistors that have two programmable solid electrolyte cells that are physically and electrically separated from each other and each cell can be programmed to be either conductive or non-conductive, which changes the capacitance of the gate stack. The channel current will thus be changed by this capacitance change. Each cell or bit can be programmed independently of each other to store two data states in a single gate stack or transistor. The non-volatile memory units are described herein can replace traditional memory units such as, for example, FLASH memory. While the present disclosure is not so limited, an appreciation of various aspects of the disclosure will be gained through a discussion of the examples provided below.

FIG. 1 is a schematic cross-sectional diagram of an illustrative non-volatile multi-bit memory unit 1 having programmable capacitance. The non-volatile multi-bit memory unit 1 includes a substrate 10 including a source region 18 and a drain region 17. The substrate 10 can be formed of any useful material such as, for example, a semiconductor material. In many embodiments, the source region 18 and a drain region 17 are doped to have an n- or p-type conductivity within an different n- or p-type conductivity substrate 10. The source region 18 and a drain region 17 are formed adjacent to a gate stack as conductive regions having a conductivity type that is different than the conductivity type of the substrate 10. For example, the source region 18 and drain region 17 can be n-type regions formed by implantation and/or diffusion of n-type dopants, such as arsenic or phosphorus. The edges of the source region 18 and drain region 17 can be generally made to coincide with, or underlap, the gate stack edges. The source region 18 and the drain region 17 can be electrically coupled to a source voltages $V_s$ and $V_d$ (via bit lines or word lines).

The multi-bit memory unit 1 has a gate stack configuration where the gate stack includes an insulating layer 11 over the substrate 10 and a first solid electrolyte layer 12A over the insulating layer 11. The first solid electrolyte layer 12A has a capacitance that is controllable between at least two states and is proximate to the source region 18. A second solid electrolyte layer 12B is over the insulating layer 11. The second solid electrolyte layer 12B has a capacitance that is controllable between at least two states and is proximate to the drain region 17. An insulating element 13 physically and electrically isolates the first solid electrolyte layer 12A from the second solid electrolyte layer 12B. A first anode 22A is electrically coupled to the first solid electrolyte layer 12A. The first solid electrolyte layer 12A is disposed between the first anode 22A and the insulating layer 11. A second anode 22B is electrically coupled to the second solid electrolyte layer 12B. The second solid electrolyte layer 12B is disposed between the second anode 22B and the insulating layer 11. A gate contact layer 14 is disposed over the substrate and between the source region 18 and a drain region 17 and in electrical connection with the first anode 22A and the second anode 22B. The gate contact layer 14 is electrically coupled to a gate voltage source $V_g$ (via a word line or bit line). In many embodiments, the insulating layer 11 can also be referred to as the gate oxide layer.

The elements of the multi-bit memory unit 1 can be formed using conventional semiconductor fabrication techniques. The multi-bit memory unit 1 can include one or more additional layers (not shown) or such as barrier layers 21A, 21B (e.g., tantalum nitride or other metal layer) between the solid electrolyte layer 12A, 12B and the insulating layer 11 and 13, or side wall elements (not shown) such as, for example, insulating sidewalls formed by blanket deposition of an insulating material. The insulating layers can be formed of any useful insulating material such as, for example, silicon oxide, silicon nitride, or silicon oxynitride. Barrier layers 21A, 21B, when present, assist in reducing or preventing diffusion or migration of the solid electrolyte layer 12A, 12B material into the insulating layer 11.

The solid electrolyte layers 12A, 12B are sandwiched between the anodes 22A, 22B and the insulating layer 11. The solid electrolyte layers 12A, 12B are each capable of being switched (independent from one another) from a first logic state to a second logic state. The solid electrolyte layer 12A, 12B uses electrochemical reaction to build or break metal dendrites in the solid electrolyte layer 12A, 12B. The multi-bit memory unit 1 voltage threshold can be changed between a high and low voltage threshold when reading each solid electrolyte layer 12A, 12B to determine if the solid electrolyte layer 12A, 12B has a first logic state to a second logic state.

In many embodiments the solid electrolyte layer 12A, 12B includes a chalcogenide material. In some embodiments the chalocogenide material is germanium-selenide ($Ge_xSe_{100-x}$) containing a silver (Ag) component. One method of providing silver to a germanium-selenide composition is to form a germanium-selenide glass and then deposit a thin layer of silver upon the glass, for example by sputtering, physical vapor deposition, or other known techniques in the art. The layer of silver is irradiated with electromagnetic energy, so that the energy passes through the silver and to the silver/glass interface, to break a chalcogenide bond of the chalcogenide material such that the glass is doped or photodoped with silver. Another method for providing silver to the glass is to provide a layer of silver-selenide on a germanium-selenide glass.

Placing the solid electrolyte layer 12A, 12B in direct contact with the anode 22A, 22B where the anode 22A, 22B includes an electrochemically active material (i.e., metal) allows the solid electrolyte layer 12A, 12B to be switched between a high resistance state and a low resistance state, via application of a voltage across the solid electrolyte layer 12A, 12B and anode 22A, 22B. Switching the solid electrolyte layer 12A, 12B between a high resistance state and a low resistance state is further described below.

Figure 2:
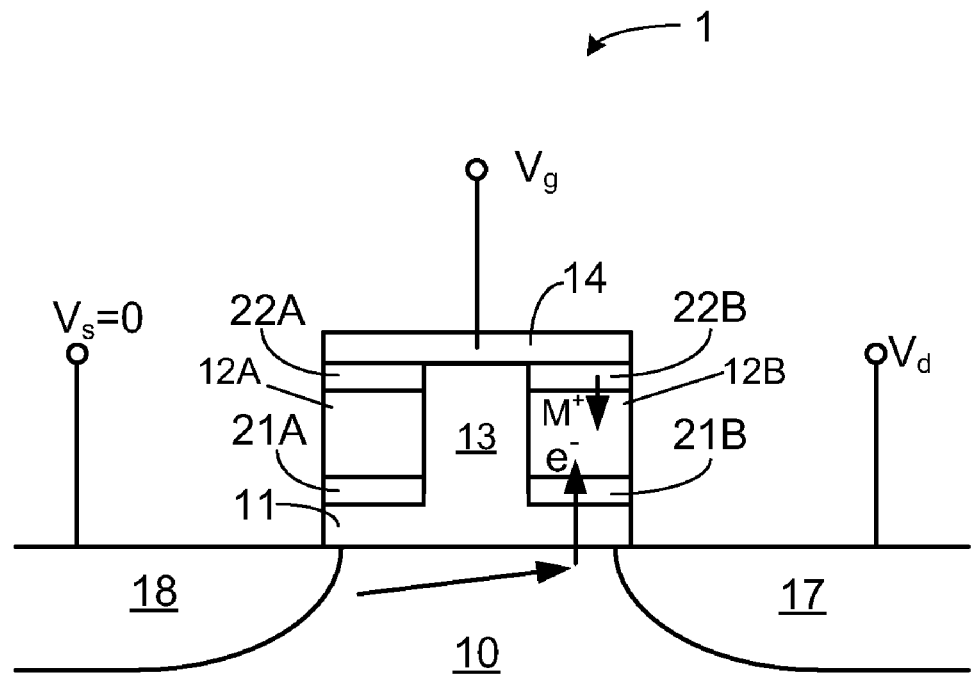
FIG. 2 is a schematic cross-sectional diagram of an exemplary non-volatile multi-bit memory unit shown in FIG. 1 during a programming operation of one solid electrolyte cell.
Figure 3:
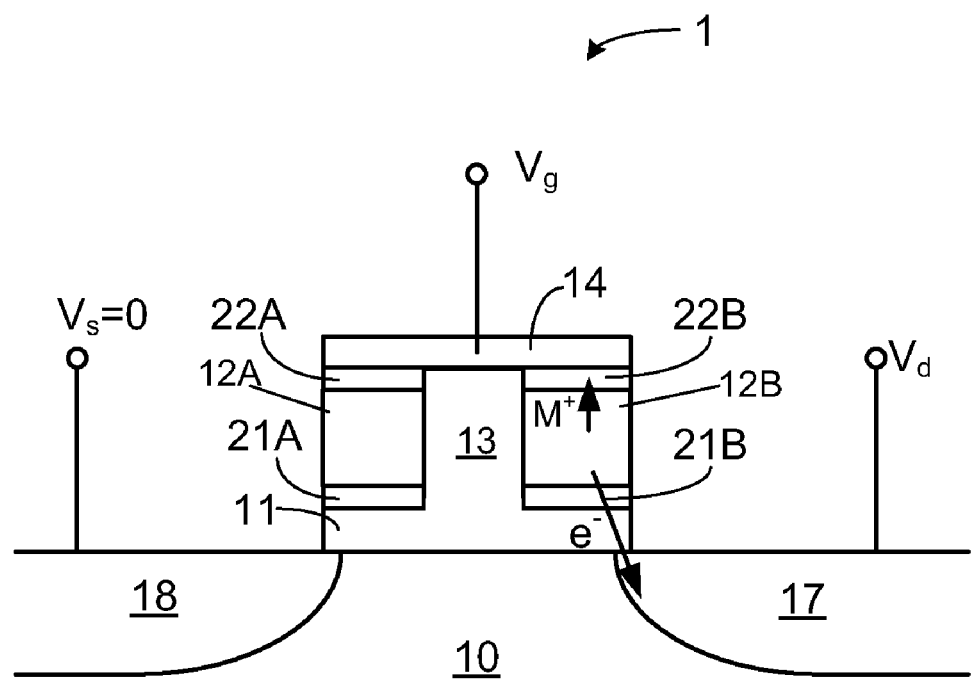
FIG. 3 is a schematic cross-sectional diagram of an exemplary non-volatile multi-bit memory unit shown in FIG. 1 during an erase operation of the solid electrolyte cell programmed in FIG. 2.

In some embodiments,

FIG. 2 is a schematic cross-sectional diagram of an exemplary non-volatile multi-bit memory unit 1 shown in FIG. 1 during a programming operation of one solid electrolyte cell 12B. FIG. 3 is a schematic cross-sectional diagram of an exemplary non-volatile multi-bit memory unit 1 shown in FIG. 1 during an erase operation of the solid electrolyte cell 12B programmed in FIG. 2. In the illustrated embodiments, the second anode 22B is formed of an electrochemically active material (e.g., copper, silver, tin) and a second barrier layer 21B (if present) is formed of an electrochemically inert material (e.g., platinum, nickel, tantalum).

Programming of the solid electrolyte cell 12B is accomplished with channel hot electron injection. A positive gate voltage $V_g$ (for example 5 to 8 V) is applied to the gate contact layer 14 and a drain voltage $V_d$ (for example 4V) is applied to the drain region 17 to program the solid electrolyte cell 12B. The source region 18 is grounded ($V_s$=0). Electrons e⁻ are injected close to the drain region 17 and metal ions M⁺ are formed at the anode 22B by the positive gate voltage $V_g$. An oxidation reaction (M→M⁺+e⁻) occurs at the electrochemically active metal (M) anode 22B solid electrolyte cell 12B interface supplying metal ions M⁺ into the solid electrolyte cell 12B and the electrons e⁻ cross the gate oxide layer (and barrier layer 21B, if present) into the solid electrolyte layer 12B. In the solid electrolyte cell 12B the supplied metal ions M⁺ and electrons e⁻ undergo a reduction reaction (M⁺+e⁻→M) and metal dendrites grow in the solid electrolyte cell 12B, increasing the cell 12B conductivity.

Erasing the solid electrolyte cell 12B is accomplished with hot holes generated in the drain region 17 from the band to band tunneling current at the drain to substrate junction. These holes injected from the drain region 17 initiate the reaction breaking down the metal dendrites within the solid electrolyte cell 12B, decreasing the cell 12B conductivity. A negative voltage $V_g$ (for example −3 to −5 V) is applied to the gate contact layer 14 and a drain voltage $V_d$ (for example 3 to 5 V) is applied to the drain region 17 to erase the solid electrolyte cell 12B. The source region 18 is grounded ($V_s$=0). Metal dendrites in the solid electrolyte cell 12B are oxidized and dissolved into metal ions M⁺ and the metal ions M⁺ drift to the anode 22B by the negative gate voltage $V_g$ and electrons e⁻ are combined with the injected holes. At the anode 22B solid electrolyte cell 12B interface metal ions M⁺ react with electrons e⁻ and metal (M) is deposited onto the anode 22B. The conductivity of the solid electrolyte layer 12B changes back to the state before programming.

Figure 4:
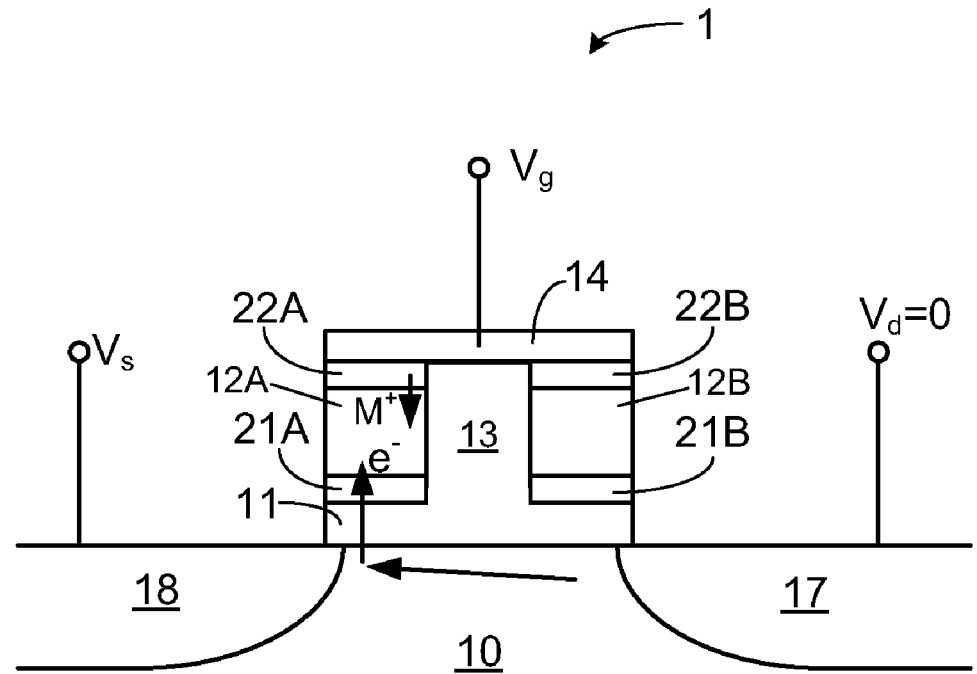
FIG. 4 is a schematic cross-sectional diagram of an exemplary non-volatile multi-bit memory unit shown in FIG. 1 during a programming operation of another solid electrolyte cell.
Figure 5:
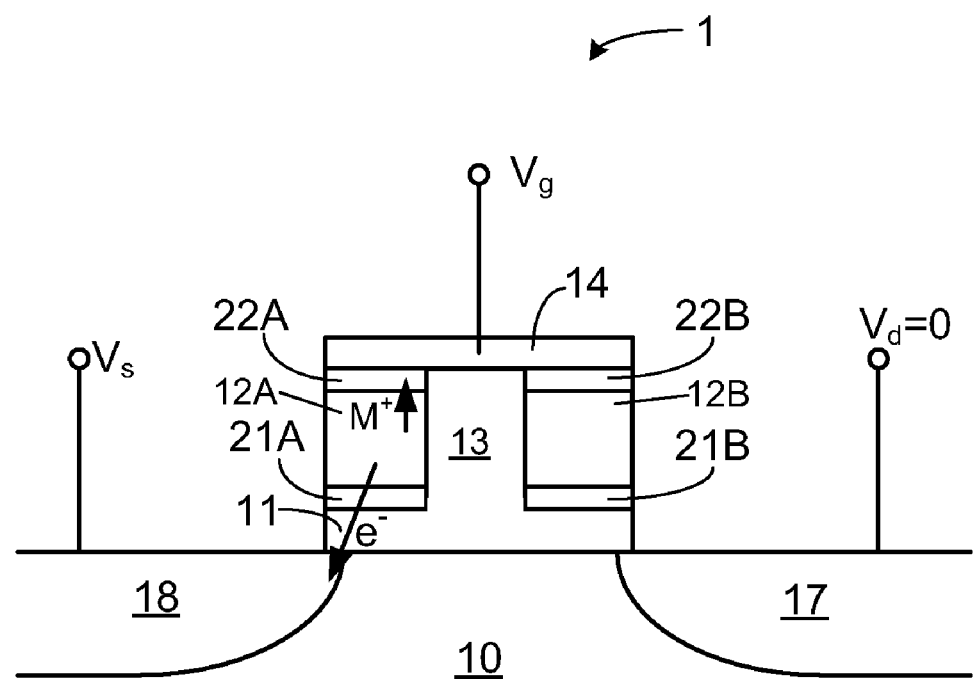
FIG. 5 is a schematic cross-sectional diagram of an exemplary non-volatile multi-bit memory unit shown in FIG. 1 during an erase operation of the solid electrolyte cell programmed in FIG. 4.

FIG. 4 is a schematic cross-sectional diagram of an exemplary non-volatile multi-bit memory unit 1 shown in FIG. 1 during a programming operation of one solid electrolyte cell 12A. FIG. 5 is a schematic cross-sectional diagram of an exemplary non-volatile multi-bit memory unit 1 shown in FIG. 1 during an erase operation of the solid electrolyte cell 12A programmed in FIG. 4. In the illustrated embodiments, the first anode 22A is formed of an electrochemically active material (e.g., copper, silver, tin) and a first barrier layer 21A (if present) is formed of an electrochemically inert material (e.g., platinum, nickel, tantalum).

Programming of the solid electrolyte cell 12A is accomplished with channel hot electron injection. A positive gate voltage $V_g$ (for example 5 to 8 V) is applied to the gate contact layer 14 and a source voltage $V_s$ (for example 4V) is applied to the source region 18 to program the solid electrolyte cell 12A. The drain region 17 is grounded ($V_d$=0). Electrons e⁻ are injected close to the source region 18 and metal ions M⁺ are formed at the anode 22A by the positive gate voltage $V_g$. An oxidation reaction (M→M⁺+e⁻) occurs at the electrochemically active metal (M) anode 22A solid electrolyte cell 12A interface supplying metal ions M⁺ into the solid electrolyte cell 12A and the electrons e⁻ cross the gate oxide layer (and barrier layer 21A, if present) into the solid electrolyte cell 12A. In the solid electrolyte cell 12A the supplied metal ions M⁺ and electrons e⁻ undergo a reduction reaction (M⁺+e⁻→M) and metal dendrites grow in the solid electrolyte cell 12A, increasing the cell 12A conductivity.

Erasing the solid electrolyte cell 12A is accomplished with hot holes generated in the source region 18 from the band to band tunneling current at the drain to substrate junction. These holes injected from the source region 18 initiate the reaction breaking down the metal dendrites within the solid electrolyte cell 12A, decreasing the cell 12A conductivity. A negative voltage $V_g$ (for example −3 to −5 V) is applied to the gate contact layer 14 and a source voltage $V_s$ (for example 3 to 5 V) is applied to the source region 18 to erase the solid electrolyte cell 12A. The drain region 17 is grounded ($V_d$=0). Metal dendrites in the solid electrolyte cell 12A are oxidized and dissolved into metal ions M⁺ and the metal ions M⁺ drift to the anode 22A by the negative gate voltage $V_g$ and electrons e⁻ are combined with the injected holes. At the anode 22A solid electrolyte cell 12A interface metal ions M⁺ react with electrons e⁻ and metal (M) is deposited onto the anode 22A. The conductivity of the solid electrolyte layer 12A changes back to the state before programming.

Each of the first region 12A and the second region 12B of the solid electrolyte layer is capable of being independently switched from a first logic state (e.g., "1") to a second logic state (e.g., "0"). Thus, this multi-bit memory unit 1 has four states (e.g., "11", "00", "10", and "01") where each bit can be independently read during the read operation.

Figure 6:
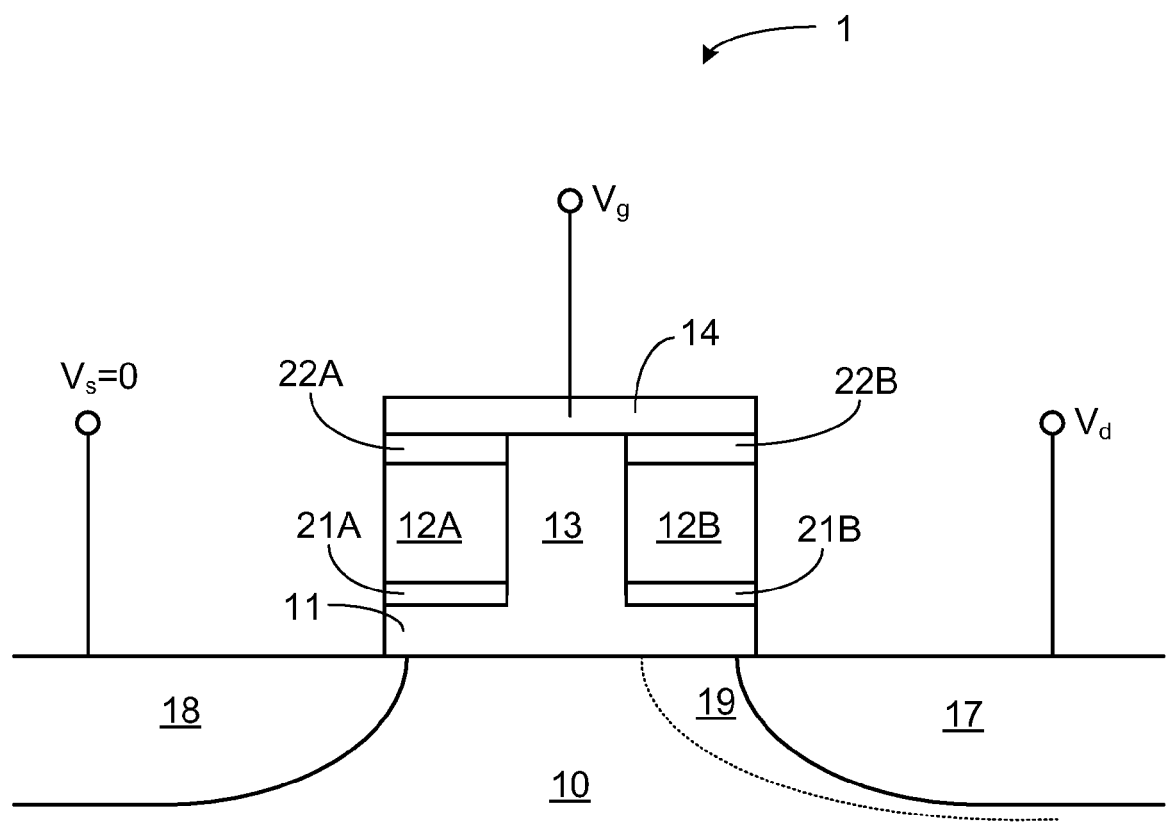
FIG. 6 is a schematic cross-sectional diagram of an exemplary non-volatile memory unit shown in FIG. 1 during a read operation of one solid electrolyte cell.

The read operation can be described as a reverse read scheme. A reverse read scheme refers to reading in a direction opposite to that of programming. FIG. 6 is a schematic cross-sectional diagram of an exemplary non-volatile memory unit 1 shown in FIG. 1 during a read operation of one solid electrolyte cell 12A. For example, to read the first bit 12A a drain voltage $V_d$ (for example 1.5 V) is applied on the drain region 17, the source region 18 is grounded ($V_s=0$), and a gate voltage $V_g$ (for example 1.2 to 3.3 V) is applied to the gate contact layer 14. A depletion region 19 will screen the second bit 12B effect on the threshold voltage. The gate current is mainly determined by the injected carriers from the detected bit 12A side and thus can tell the state of the first bit 12A. Reading the second bit 12B is accomplished in the same manner except that the a source voltage $V_s$ (for example 1.5 V) is applied to the source region 18 and the drain region 17 is grounded.

A depletion region (not shown) will screen the first bit 12A effect on the threshold voltage due to the second bit 12B, as described above.

Thus, embodiments of the NON-VOLATILE MULTI-BIT MEMORY WITH PROGRAMMABLE CAPACITANCE are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A multi-bit memory unit, comprising:
   a substrate including a source region and a drain region;
   an insulating layer over the substrate;
   a first solid electrolyte cell over the insulating layer, the first solid electrolyte cell having a capacitance that is controllable between at least two states and proximate the source region;
   a second solid electrolyte cell over the insulating layer, the second solid electrolyte cell having a capacitance that is controllable between at least two states and proximate the drain region;
   an insulating element that isolates the first solid electrolyte cell from the second solid electrolyte cell;
   a first anode electrically coupled to the first solid electrolyte cell;
   a second anode electrically coupled to the second solid electrolyte cell; and
   a gate contact layer over the substrate and between the source region and drain region and in direct electrical connection with the first anode and the second anode, the gate contact layer electrically coupled to a voltage source.

2. A multi-bit memory unit according to claim 1, wherein the first solid electrolyte cell and the second solid electrolyte cell are coplanar with the insulating element.

3. A multi-bit memory unit according to claim 1, further comprising a first barrier layer disposed between the first solid electrolyte cell and the insulating layer, the first barrier layer configured to reduce metal diffusion into the insulating layer, and a second barrier layer disposed between the second solid electrolyte cell and the insulating layer, the second barrier layer configured to reduce metal diffusion into the insulating layer.

4. A multi-bit memory unit according to claim 1, wherein the first solid electrolyte cell capacitance is controlled by building or breaking metal dendrites within the first solid electrolyte cell and the second solid electrolyte cell capacitance is controlled by building or breaking metal dendrites within the second solid electrolyte cell.

5. A multi-bit memory unit according to claim 1, wherein the first solid electrolyte cell is between the first anode and the insulating layer and the second solid electrolyte cell is between the second anode and the insulating layer.

6. A multi-bit memory unit according to claim 1, wherein the first anode and second anode comprises an electrochemically active metal.

7. A multi-bit memory unit according to claim 1, wherein the first solid electrolyte cell is controllable between the at least two states and the second solid electrolyte cell is controllable between at least two states, and the state of the first solid electrolyte cell can be different than the state of the second solid electrolyte cell.

8. A multi-bit memory unit according to claim 1, wherein the first solid electrolyte cell capacitance is controllable between at least two states with an application of a voltage across the gate contact layer and the source region.

9. A multi-bit memory unit according to claim 1, wherein the second solid electrolyte cell capacitance is controllable between at least two states with an application of a voltage across the gate contact layer and the drain region.

10. A multi-bit memory unit according to claim 1, wherein the first solid electrolyte cell state or the second solid electrolyte cell state are independently read by a reverse read process.

11. A multi-bit memory unit according to claim 1, wherein the first solid electrolyte cell and the second solid electrolyte cell comprise a chalcogenide material.

12. A multi-bit memory unit, comprising:
    a substrate including a source region and a drain region;
    an insulating layer over the substrate;
    a first solid electrolyte cell disposed between a first anode and a first barrier layer, the first solid electrolyte cell located over the insulating layer, the first solid electrolyte cell having a capacitance that is controllable between at least two states;
    a second solid electrolyte cell disposed between a second anode and a second barrier layer, the second solid electrolyte cell located over the insulating layer, the second solid electrolyte cell having a capacitance that is controllable between at least two states; and
    a gate contact layer located over the substrate and between the source region and drain region and the gate contact layer in electrical connection with the first anode and the second anode, the gate contact layer electrically coupled to a voltage source;
    wherein the first solid electrolyte cell is between the gate contact layer and the substrate and located closer to the source region than the second solid electrolyte cell and the second solid electrolyte cell is between the gate contact layer and the substrate and located closer to the drain region than the first solid electrolyte cell, and the first solid electrolyte cell is electrically isolated from the second solid electrolyte cell.

13. A multi-bit memory unit according to claim 12, wherein the first solid electrolyte cell and the second solid electrolyte cell comprise a chalcogenide material.

14. A multi-bit memory unit according to claim 12, wherein the first solid electrolyte cell and the second solid electrolyte cell are coplanar with an insulating element separating the first solid electrolyte cell from the second solid electrolyte cell.

15. A multi-bit memory unit according to claim 12, wherein the first solid electrolyte cell capacitance is controlled by building or breaking metal dendrites within the first solid electrolyte cell and the second solid electrolyte cell capacitance is controlled by building or breaking metal dendrites within the second solid electrolyte cell.

16. A multi-bit memory unit according to claim 12, wherein the first anode and second anode comprises an electrochemically active metal.

17. A multi-bit memory unit according to claim 12, wherein the first solid electrolyte cell capacitance is controllable between at least two states with an application of a voltage across the gate contact layer and the source region, and the second solid electrolyte cell capacitance is controllable between at least two states with an application of a voltage across the gate contact layer and the drain region.

18. A multi-bit memory unit according to claim 12, wherein the first solid electrolyte cell state or the second solid electrolyte cell state are independently read by a reverse read process.

19. A multi-bit non-volatile memory unit, comprising:
a substrate including a source region and a drain region, the source region electrically coupled to a source voltage source and the drain region electrically coupled to a drain voltage source;
an insulating layer over the substrate;
a first solid electrolyte cell disposed between a first electrochemically active anode and a first barrier layer, the first solid electrolyte cell over the insulating layer, the first solid electrolyte cell having a capacitance that is controllable between at least two states;
a second solid electrolyte cell disposed between a second electrochemically active anode and a second barrier layer, the second solid electrolyte cell over the insulating layer, the second solid electrolyte cell having a capacitance that is controllable between at least two states; and
a gate contact layer over the substrate and between the source region and drain region and in direct electrical connection with the first anode and the second anode, the gate contact layer electrically coupled to a gate voltage source;
wherein the first solid electrolyte cell is located closer to the source region than the second solid electrolyte cell and the second solid electrolyte cell is located closer to the drain region than the first solid electrolyte cell, and the first solid electrolyte cell, first anode and first barrier layer are electrically isolated from the second solid electrolyte cell, second anode and second barrier layer.

20. A multi-bit non-volatile memory unit according to claim 19, wherein the first solid electrolyte cell and the second solid electrolyte cell comprise a chalcogenide material that has a conductivity that is controllable between at least two states.

* * * * *